United States Patent
Kerstein et al.

[11] Patent Number: 6,058,112
[45] Date of Patent: May 2, 2000

[54] INTERNAL RULES CHECKER DIAGNOSTIC MODE

[75] Inventors: Denise Kerstein, Palo Alto; Thomas J. Runaldue, Mountain View, both of Calif.

[73] Assignee: Advanced Micro Devices, Inc., Sunnyvale, Calif.

[21] Appl. No.: 08/992,492

[22] Filed: Dec. 18, 1997

Related U.S. Application Data

[60] Provisional application No. 60/038,025, Feb. 14, 1997, abandoned.

[51] Int. Cl.[7] .................................................. H04J 3/02
[52] U.S. Cl. ...................... 370/389; 370/244; 370/422; 370/426
[58] Field of Search ................................. 370/389, 392, 370/401, 407, 241, 242, 243, 244, 250, 445, 446, 422, 426

[56] References Cited

U.S. PATENT DOCUMENTS

| | | |
|---|---|---|
| 4,866,421 | 9/1989 | Szczepanek . |
| 5,218,602 | 6/1993 | Grant et al. . |
| 5,305,321 | 4/1994 | Crayford . |
| 5,515,376 | 5/1996 | Murthy et al. . |
| 5,592,486 | 1/1997 | Lo et al. . |
| 5,790,254 | 8/1998 | Bennett et al. ........................... 370/244 |
| 5,864,553 | 1/1999 | Aramaki ................................... 370/422 |
| 5,991,305 | 11/1999 | Simmons et al. ........................ 370/422 |

FOREIGN PATENT DOCUMENTS

| | | |
|---|---|---|
| 0 495 575 | 7/1992 | European Pat. Off. . |
| WO 96 29796 | 9/1996 | WIPO . |
| WO 96 38949 | 12/1996 | WIPO . |

*Primary Examiner*—Salvatore Cangialosi

[57] ABSTRACT

A network switch data decision making engine is diagnosed while the switch is operating or after an error is detected. The switch receives data from connected stations and sends header information to the decision making engine. The header information is simultaneously transmitted to an external device. The decision making engine generates a data forwarding decision and outputs the decision to the external device. The operation of the decision making engine can then be checked by an external crevice, such as a logic analyzer.

14 Claims, 6 Drawing Sheets

Fig. 4 ERC_DATA and ERC_CTRL Transfer to ERC

Fig. 6 PRT_VCTR and PV_STRB Transfer from ERC

Fig. 5  ERCI Data Timings

Fig. 7  ERCI Port Vector Timings

INTERNAL RULES CHECKER DIAGNOSTIC MODE

RELATED APPLICATIONS

This application claims priority from provisional patent application Ser. No. 60/038,025, filed Feb. 14, 1997, entitled INTEGRATED MULTIPORT SWITCH (attorney docket 1033-230PRO), now abandoned, which is incorporated herein by reference.

TECHNICAL FIELD

This invention relates to network communications and more particularly to verifying the operation of a device used to make data forwarding decisions.

BACKGROUND ART

In computer networks, a plurality of network stations are interconnected via a communications medium. For example, Ethernet is a commonly used local area network scheme in which multiple stations are connected to a single shared serial data path. These stations often communicate with a network switch located between the shared data path and the stations connected to that path. Typically, the switch controls the communication of data packets on the network.

The network switch includes switching logic for receiving and forwarding frames to the appropriate destination. In many prior art systems, if a problem occurs in the routing of data packets on the network, there is no way to determine the cause of the problem. In addition, there is no way to check the operation of the switch before a problem occurs.

SUMMARY OF THE INVENTION

There exists a need for a switching device that can be diagnosed to determine if it is working properly when a problem occurs.

There is also a need for a switching device that can be monitored while it is operating to verify its operation.

These and other needs are met by the present invention, where data received by a network switch is routed to an internal decision making engine which makes data frame forwarding decisions. The data sent to the internal decision making engine and the output from the decision making engine is sent to an external device where the functioning of the internal decision making engine can be analyzed.

According to one aspect of the invention, a network switch that controls communication of data frames between network stations includes an internal decision making engine located in the switch. The decision making engine receives frame header information from received data frames, and the switch simultaneously outputs the frame header information to an external device. The switch includes a second output for transmitting the frame forwarding information from the internal decision making engine to the external device.

Another aspect of the present invention provides a method for verifying the operation of an internal decision making engine located on a network switch. The method includes receiving data from connected stations and simultaneously sending header information from the received data to the internal decision making engine and to an external device. The internal decision making engine generates data forwarding information from the header information and transmits this information to the external device enabling the external device to compare the performance of the internal decision making engine with prescribed switching logic.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

DETAILED DESCRIPTION OF THE INVENTION

The present invention will be described with the example of a switch in a packet switched network, such as an Ethernet (IEEE 802.3) network. A description will first be given of the switch architecture, followed by a detailed description of the internal rules checker diagnostic mode. It will become apparent, however, that the present invention is also applicable to other packet switched systems, as described in detail below.

SWITCH ARCHITECTURE

Figure 1:
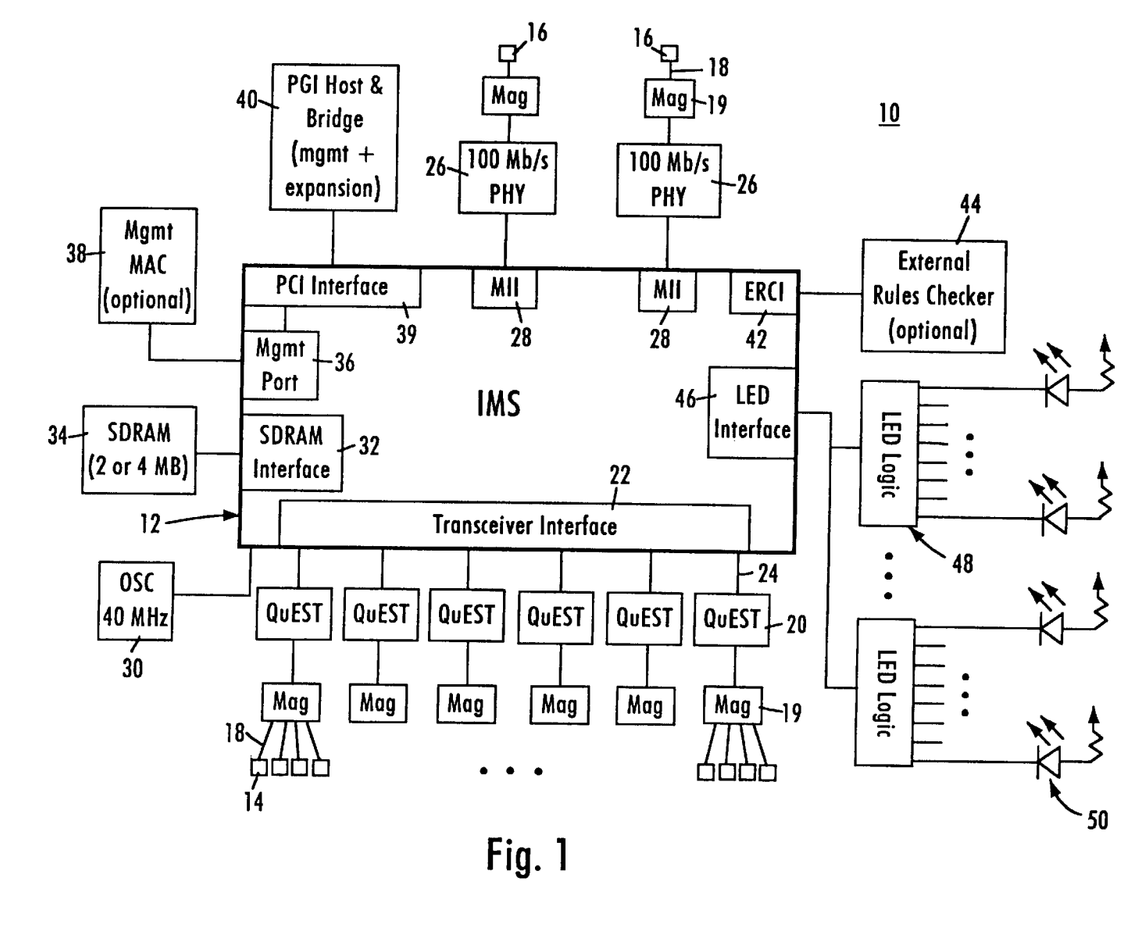
FIG. 1 is a block diagram of a packet switched system in which the present invention may be utilized.

FIG. 1 is a block diagram of an exemplary system in which the present invention may be advantageously employed. The exemplary system 10 is a packet switched network, such as an Ethernet network. The packet switched network includes an integrated multiport switch (IMS) 12 that enables communication of data packets between network stations. The network may include network stations having different configurations, for example twenty-four (24) 10 megabit per second (Mb/s) network stations 14 that send and receive data at a network data rate of 10 Mb/s, and two 100 Mb/s network stations 16 that send and receive data packets at a network speed of 100 Mb/s. The multiport switch 12 selectively forwards data packets received from the network stations 14 or 16 to the appropriate destination based upon Ethernet protocol.

According to the disclosed embodiment, the 10 Mb/s network stations 14 send and receive data packets to and from the multiport switch 12 via a media 18 and according to half-duplex Ethernet protocol. The Ethernet protocol ISO/IEC 8802-3 (ANSI/IEEE Std. 802.3, 1993 Ed.) defines a half-duplex media access mechanism that permits all stations 14 to access the network channel with equality. Traffic in a half-duplex environment is not distinguished or prioritized over the medium 18. Rather, each station 14 includes an Ethernet interface card that uses carrier-sense multiple access with collision detection (CSMA/CD) to listen for traffic on the media. The absence of network traffic is detected by sensing a deassertion of a receive carrier on the media. Any station 14 having data to send will attempt to access the channel by waiting a predetermined time after the deassertion of a receive carrier on the media, known as the interpacket gap interval (IPG). If a plurality of stations 14 have data to send on the network, each of the stations will attempt to transmit in response to the sensed deassertion of the receive carrier on the media and after the IPG interval, resulting in a collision. Hence, the transmitting station will monitor the media to determine if there has been a collision due to another station sending data at the same time. If a collision is detected, both stations stop, wait a random amount of time, and retry transmission.

The 100 Mb/s network stations 16 preferably operate in full-duplex mode according to the proposed Ethernet standard IEEE 802.3x Full-Duplex with Flow Control—Working Draft (0.3). The full-duplex environment provides a two-way, point-to-point communication link between each 100Mb/s network station 16 and the multiport switch 12, where the IMS and the respective stations 16 can simultaneously transmit and receive data packets without collisions. The 100Mb/s network stations 16 each are coupled to network media 18 via 100Mb/s physical (PHY) devices 26 of type 100 Base-TX, 100 Base-T4, or 100 Base-FX. The multiport switch 12 includes a media independent interface (MII) 28 that provides a connection to the physical devices 26. The 100Mb/s network stations 16 may be implemented as servers or routers for connection to other networks. The 100Mb/s network stations 16 may also operate in half-duplex mode, if desired. Similarly, the 10 Mb/s network stations 14 may be modified to operate according to full-duplex protocol with flow control.

As shown in FIG. 1, the network 10 includes a series of switch transceivers 20 that perform time division multiplexing and time division demultiplexing for data packets transmitted between the multiport switch 12 and the 10 Mb/s stations 14. A magnetic transformer module 19 maintains the signal waveform shapes on the media 18. The multiport switch 12 includes a transceiver interface 22 that transmits and receives data packets to and from each switch transceiver 20 using a time-division multiplexed protocol across a single serial non-return to zero (NRZ, interface 24. The switch transceiver 20 receives packets from the serial NRZ interface 24, demultiplexes the received packets, and outputs the packets to the appropriate end station 14 via the network media 18. According to the disclosed embodiment, each switch transceiver 20 has four independent 10 Mb/s twisted-pair ports and uses 4:1 multiplexing across the serial NRZ interface enabling a four-fold reduction in the number of PINs required by the multiport switch 12.

The multiport switch 12 contains a decision making engine, switching engine, buffer memory interface, configuration/control/status registers, management counters, and MAC (media access control) protocol interface to support the routing of data packets between the Ethernet ports serving the network stations 14 and 16. The multiport switch 12 also includes enhanced functionality to make intelligent switching decisions, and to provide statistical network information in the form of management information base (MIB) objects to an external management entity, described below. The multiport switch 12 also includes interfaces to enable external storage of packet data and switching logic in order to minimize the chip size of the multiport switch 12. For example, the multiport switch 12 includes a synchronous dynamic RAM (SDRAM) interface 32 that provides access to an external memory 34 for storage of received frame data, memory structures, and MIB counter information. The memory 34 may be an 80, 100 or 120 MHz synchronous DRAM having a memory size of 2 or 4 Mb.

The multiport switch 12 also includes a management port 36 that enables an external management entity to control overall operations of the multiport switch 12 by a management MAC interface 38. The multiport switch 12 also includes a peripheral component interconnect (PCI) interface 39 enabling access by the management entity via a PCI host and bridge 40. Alternatively, the PCI host and bridge 40 may serve as an expansion bus for a plurality of IMS devices 12.

The multiport switch 12 includes an internal decision making engine that selectively transmits data packets received from one source to at least one destination station. The multiport switch 12 includes an external rules checker interface (ERCI) 42 that allows an external rules checker (ERC) 44 to make frame forwarding decisions in place of the internal decision making engine. Hence, frame forwarding decisions can be made either by the internal switching engine or the external rules checker 44.

The multiport switch 12 also includes an LED interface 46 that clocks out the status of conditions per port and drives LED external logic 48. The LED external logic 48, in turn, drives LED display elements 50 that are human readable. An oscillator 30 provides a 40 MHz clock input, for the system functions of the multiport switch 12.

Figure 2:
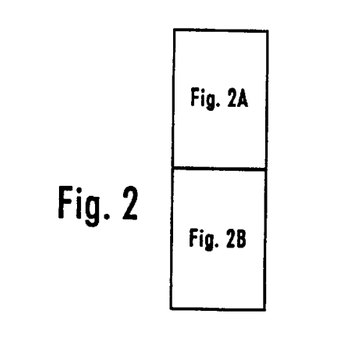
FIG. 2 is a block diagram of a multiport switch constructed in accordance with an embodiment of the present intention and used in the packet switched system of FIG. 1.
Figure 2A:
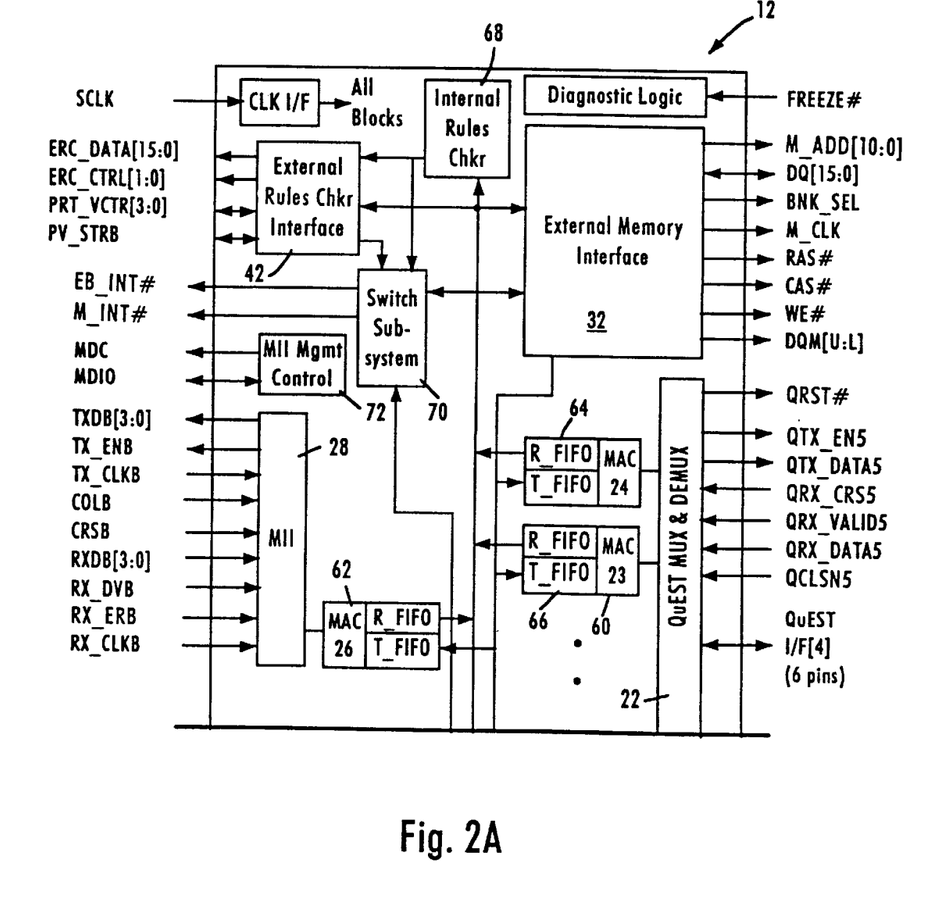
Figure 2B:
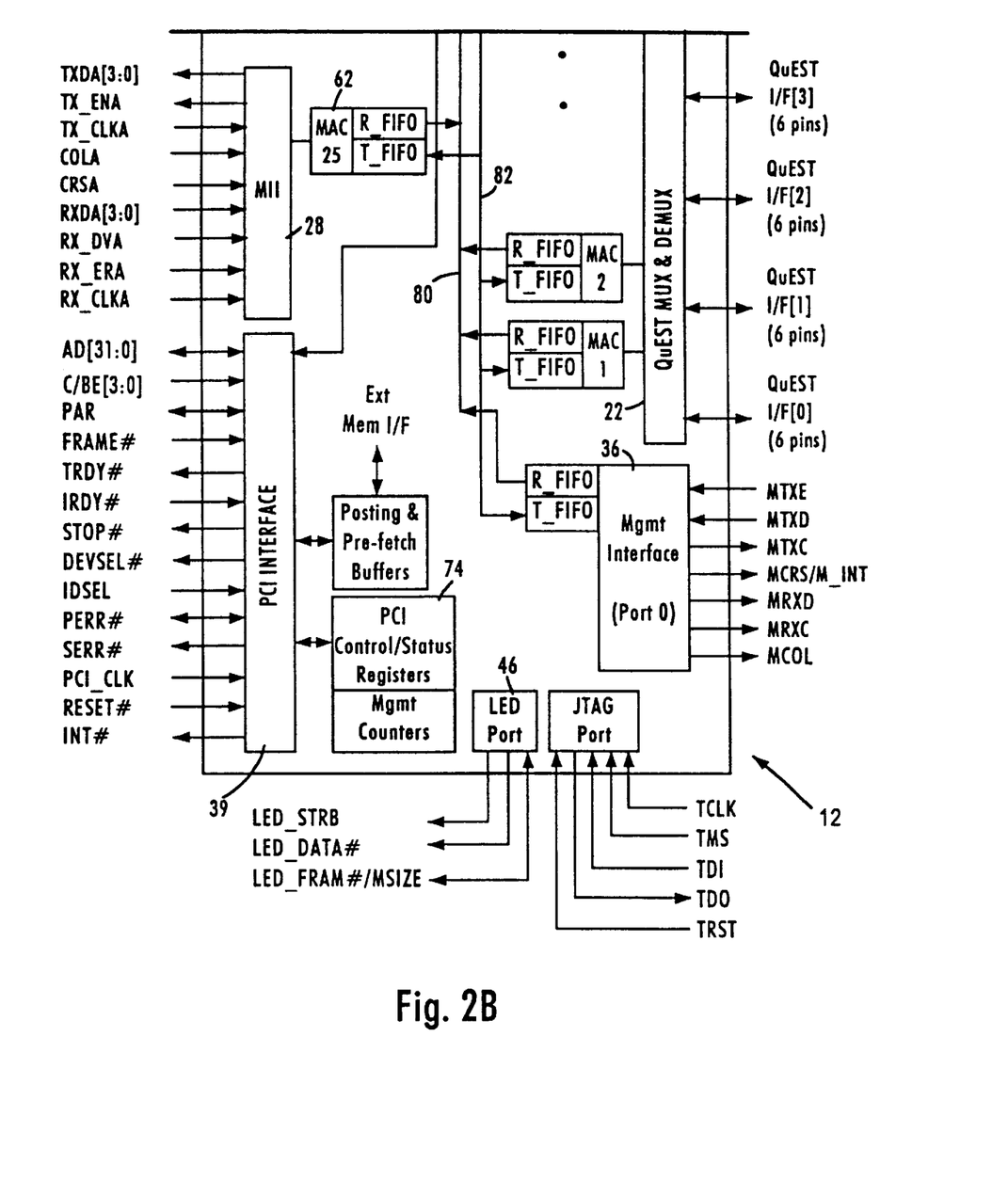

FIG. 2 is a block diagram of the multiport switch 12 of FIG. 1. The multiport switch 12 includes twenty-four (24) 10 Mb/s media access control (MAC) ports 60 for sending and receiving data packets in half-duplex between the respective 10 Mb/s network stations 14 (ports 1–24), and two 100 Mb/s MAC ports 62 for sending and receiving data packets in full-duplex between the respective 100 Mb/s network stations 16 (ports 25, 26). As described above, the management interface 36 also operates according to MAC layer protocol (port 0). Each of the MAC ports 60, 62 and 36 has a receive first-in-first-out (FIFO) buffer 64 and transmit FIFO 66. Data packets from a network station are received by the corresponding MAC port and stored in the corresponding receive FIFO 64. The received data packet is output from the corresponding receive FIFO 64 to the external memory interface 32 for storage in the external memory 34.

Additional interfaces provide management and control information. For example, a management data interface 72 enables the multiport switch 12 to exchange control and status information with the switch transceivers 20 and the 100 Mb/s physical devices 26 according to the MII management specification (IEEE 802.3u). For example, the management data interface 72 outputs a management data clock (MDC) providing a timing reference on the bidirectional management data IO (MDIO) signal path.

The PCI interface 39 is a 32-bit PCI revision 2.1 compliant slave interface for access by the PCI host processor 10 to internal IMS status and configuration registers 74, and access external memory SDRAM 34. The PCI interface can also serve as an expansion bus for multiple IMS devices. The management port 36 interfaces to an external MAC engine through a standard seven-wire inverted serial GPSI interface, enabling a host controller access to the multiport switch 12 via a standard MAC layer protocol.

Figure 3:
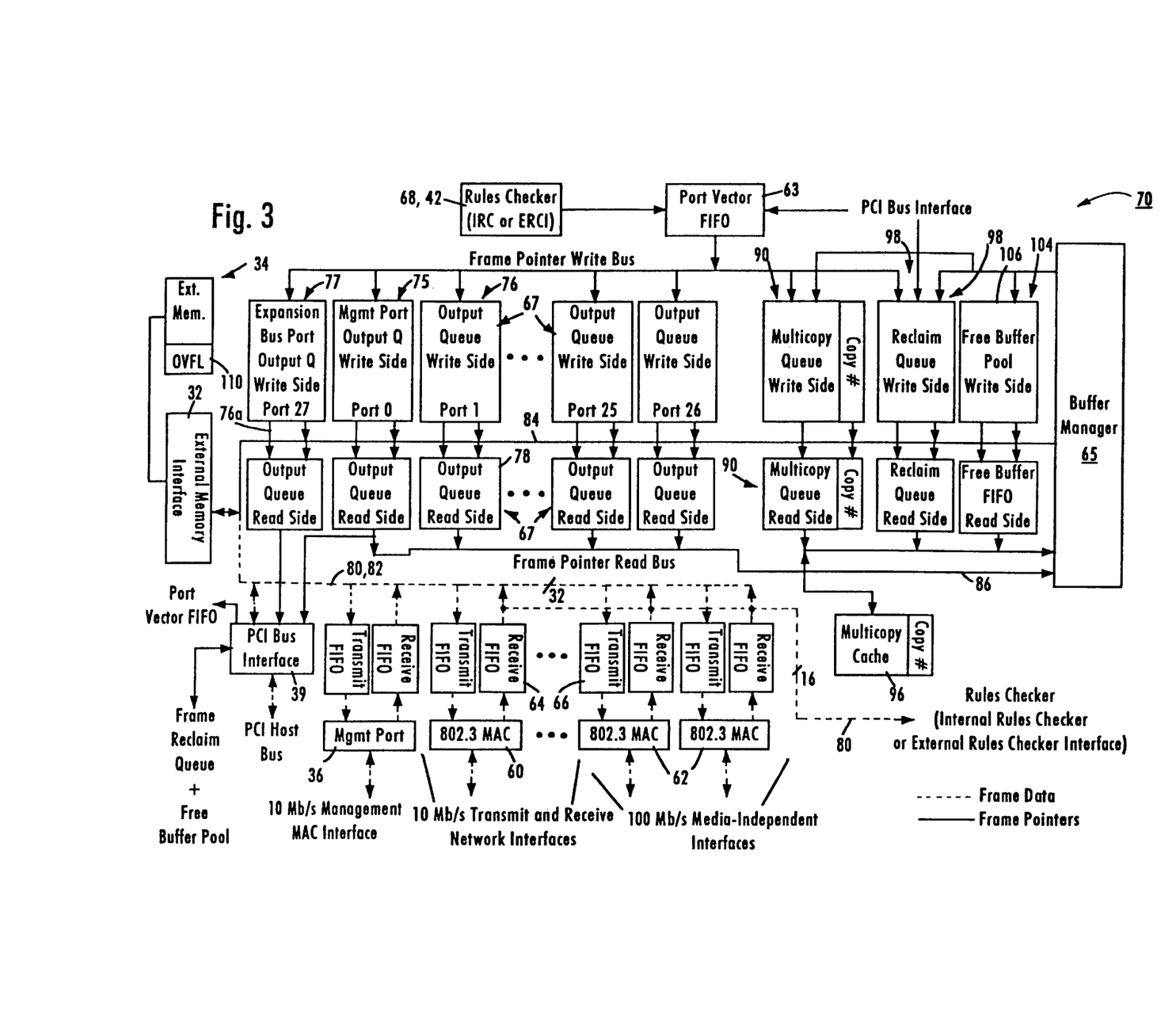
FIG. 3 is a detailed block diagram of the switch subsystem of FIG. 2.

FIG. 3 depicts the switch subsystem 70 of FIG. 2 according to an exemplary embodiment of the present invention. Other elements of the multiport switch 12 of FIG. 2 are reproduced in FIG. 3 to illustrate the connections of the switch subsystem 70 to these other elements. The switch subsystem 70 contains the core switching engine for receiving and forwarding frames. The main functional blocks used to implement the switching engine include: a port vector FIFO 63, a buffer manager 65, a plurality of port output queues 67, a management port output queue 75, an expansion bus port output queue 77, a free buffer pool 104, a multicopy queue 90, a multicopy cache 96 and a reclaim queue 98.

There are two basic types of frames that enter the multiport switch 12 from the ports: unicopy frames and multicopy frames. A unicopy frame is a frame that is received at a port which is to be transmitted by the multiport switch 12 to only one other port. By contrast, a multicopy frame is a frame that is received at one port for transmission to more than one port. In FIG. 3, each port is represented by a corresponding MAC 60, 62, or 36 having its own receive FIFO 64 and transmit FIFO 66.

Frames, whether unicopy or multicopy, are received by the internal MAC engines 60, 62, or 36, and placed in the corresponding receive FIFO 64. Each data frame has a header including at least a destination address, a source address, and type/length information. The header of the received packet is also forwarded to a decision making engine to determine which MAC ports will output the data packet. The multiport switch 12 supports two decision making engines, an internal rules checker (IRC) 68 and an external rules checker (ERC) 44. In order for the ERC 44 to function, the multiport switch 12 sends data to the ERC 44 via the external rules checker interface (ERCI) 42. The ERCI 42 is enabled and disabled via a rules checker configuration register 74 located on the multiport switch 12. The IRC 68 and ERCI 42 do not operate simultaneously. The IRC 68 and ERC 44 provide the decision making logic for determining the destination MAC port for a given data packet. The decision making engine may determine that a given data packet is transmitted to either a single port, multiple ports, or all ports (i.e., broadcast).

As described above, the multiport switch 12 provides the switching logic for receiving and forwarding frames to the appropriate output ports. The frame forwarding decisions however, are made by the rules checker, either the IRC 68 or the ERC 44. The rules checker contains a set of addresses along with VLAN associations and forwarding port vectors. When a port on multiport switch 12 receives a frame, it sends a frame pointer (location in external memory 34 where the frame is stored), the receive port number, destination address (DA) and source address (SA) to the rules checker. If the IRC 68 is enabled, the port also forwards hash keys and VLAN ID (if applicable). The rules checker searches its address table for the appropriate addresses and makes a forwarding decision based upon the SA, receive port, DA and VLAN associations. It then forwards the frame pointer, a forwarding port vector, the VLAN index (if appropriate) and a control opcode to the port vector FIFO 63 (See FIG. 3).

The IRC 68 provides logic to support 512 user addresses and capabilities for 32 unique VLANs. The ERC 44 via the ERCI 42 supports a much larger number of addresses, VLANs and routing functions. In the exemplary embodiment, the ERC 44 supports over 8000 addresses. The logic for the ERC 44 and IRC 68 function in the same manner. The discussion below assumes that the ERCI 42 is enabled.

The rules checker configuration register 74 which enables the ERCI 42, also programs the number of bytes of data forwarded to the ERC 44, described in detail below.

The EFCI 42 is sized to support communication with all of the ports on multiport switch 12. Specifically, the ERCI 42 is sized so that when all of the ports on the network are simultaneously active, the ERCI 42 transmits header information from each packet to the ERC 44. The ERC 44 makes its forwarding decision and transmits the decision back to the multiport switch 12, via the ERCI 42, before the packet must be forwarded. However, there is no restriction on the length of time required for the ERC 44 to make the forwarding decisions, such as to make the decisions before the frame is completely buffered to external memory. There is also no requirement to make forwarding decisions in the same order as frames are received.

For example, the ERC 44 may make a decision for some packets based on the DA and SA. For other packets, the ERC 44 may look at the packet data and determine that the packet contains data which has a higher priority, for example, the data may be multicast data which is being sent to all the stations. In this situation, the ERC 44 may prioritize this multicast data and send forwarding information to the ERCI 42 before lower-priority data which was received earlier. Further, the ERC 44 may push the multicast data out more quickly than for standard data using a hardware assist or other procedure to enable the data to be transmitted back to the multiport switch more quickly than for normal data packets.

Figure 4:
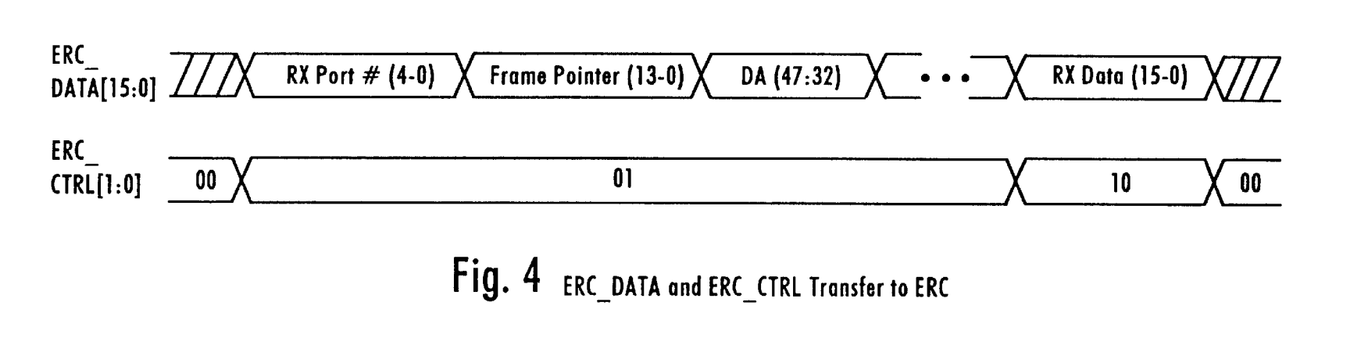
FIG. 4 illustrates the data transmitted to the external rules checker via the external rules checker interface.

With reference to FIG. 4, the ERCI 42 forwards data to the ERC 44 on a 16-bit ERC data bus, ERC DATA [15:0], synchronous to the system clock, SCLK. In the exemplary Embodiment, SCLK is a 40 MHz oscillator shared by the multiport switch 12 and switch transceivers 20. The ERCI 42 transmits a 5-bit receive port number on ERC DATA [4:0], the frame pointer on ERC DATA [13:0] and a programmed number of bytes of the received frame. The data after DA (destination address) in FIG. 4 represents the programmable bytes of data. The frame pointer is the address in external memory 34 where the frame is stored. The ERCI 42 transmits a maximum of 64 bytes of the received frame and the actual number of bytes transmitted is programmed in the rules checker configuration register 74. At a minimum, the ERCI 42 transmits the receive port, destination address (DA), source address (SA) and the frame pointer. In situations where the ERCI 42 transmits an odd number of bytes to the ERC 44, ERC DATA [7:0] is the active byte lane on the last transfer.

Figure 5:
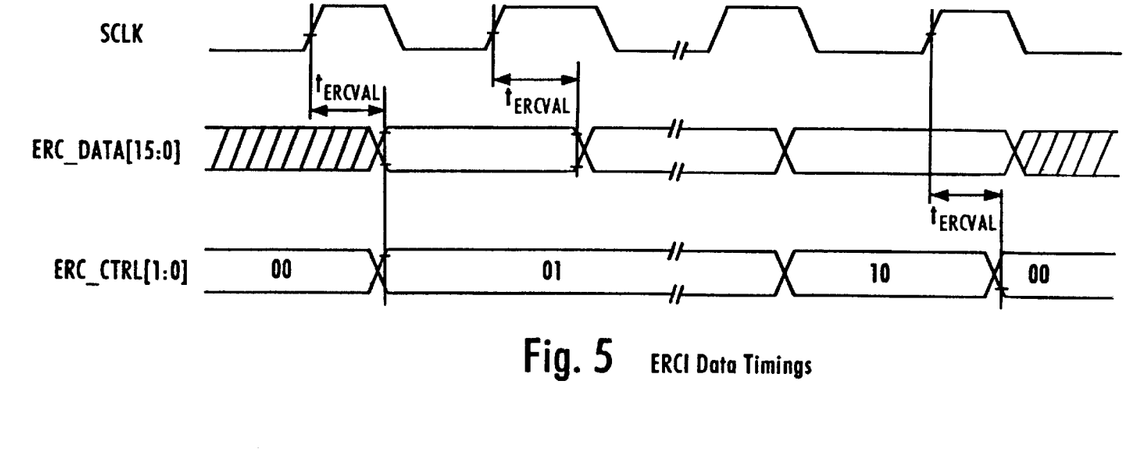
FIG. 5 illustrates the timing of the data transfer of FIG. 4.

The ERCI 42 also outputs control data on a 2-bit ERC control bus, ERC CTRL. The ERC control signal indicates when ERC data is active. For example, ERC CTRL bits "00" indicate that the ERC DATA is idle, "01" indicate that both bytes on ERC DATA are active, "10" indicate that this the current transfer is the last transfer and one or both bytes on ERC DATA are active and "11" indicate that data on ERC DATA is to be aborted. The multiport switch 12, via the ERCI 42, aborts the frame results if a runt or an errored frame is received by transmitting the "11" on ERC CTRL. The ERC 44 will not send back any port vector information for a frame where ERC CTRL [1:0] is "11" FIG. 5 shows a data timing diagram of ERC DATA [15:0] and ERC CTRL [1:0].

Figure 6:
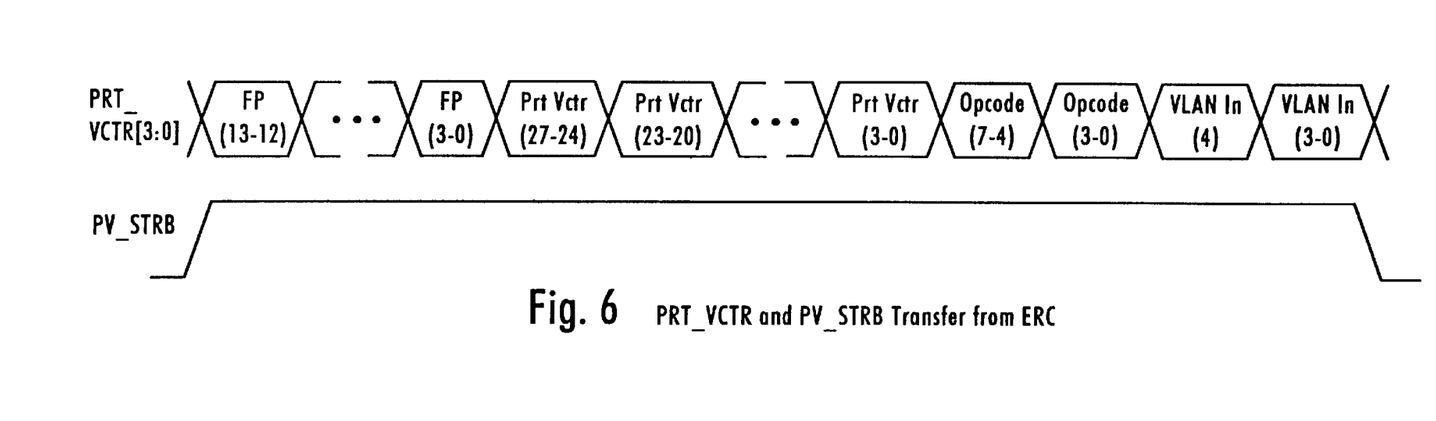
FIG. 6 illustrates the data transmitted from the external rules checker to the external rules checker interface.
Figure 7:
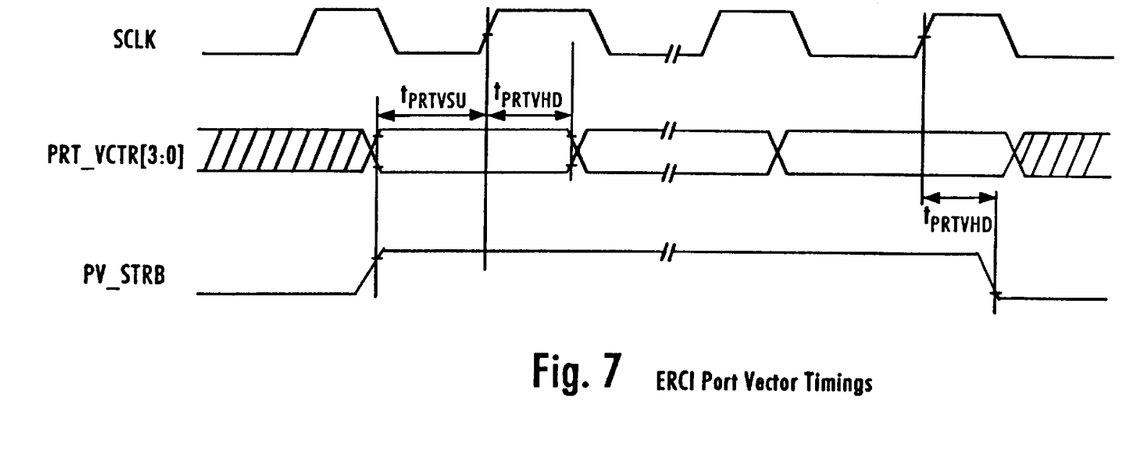
FIG. 7 illustrates timing of the data transfer of FIG. 6.

The ERC 44 receives the data from ERCI 42 and searches its address table for the appropriate addresses and makes a forwarding decision based upon the received data. With reference to FIG. 6, the ERC 44 sends a frame pointer (14 bits), the forwarding Port Vector (28 bits), the Control Opcode (8 bits) and the VLAN Index (5 bits) on a four bit port vector bus, PRT VCTR [3:0]. The ERCI 42 transmits the data on PRT VCTR [3:0], synchronous to SCLK, to the switch subsystem 70. ERC 44 pads the fields to 16 bits for the frame pointer, 28 bits for the Port Vector, 8 bits for the VLAN Index and 8 bits for the Control Opcode. A frame signal, port vector strobe, PV STRB, indicates when data is valid on PRT VCTR [3:0]. For diagnostic purposes, the multiport switch 12 can be monitored on port vector, PRT VCTR or PV STRB. FIG. 7 shows a timing diagram of the port vector bus and port vector strobe signal in relation to SCLK.

The ERCI 42 outputs the forwarding decision to switch subsystem 70. The switch subsystem 70 fetches the data packet identified in the port vector from the external memory 34 via the external memory interface 32, and supplies the retrieved data packet to the appropriate transmit FIFO 66 of the identified ports. The switch subsystem may send a given data packet to either a single port, multiple ports, or all ports (i.e., broadcast) based on the output from ERC 44. For example, the received data packet may include a destination address that identifies a plurality of network stations. Alternatively, the received packet may include a VLAN (virtual IAN) tagged frame according to IEEE 802.1d protocol that specifies another network (via a router at one of the 100Mb/s stations 16) or a prescribed group of stations. Hence, the ERC 44 via the ERCI 42 decides whether a frame temporarily stored in the buffer memory 34 should be output to a single MAC or multiple MAC ports.

As described above, the ERC 44, based on the information in the header, determines from where the frame packet will be transmitted. The description below assumes that either the IRC 68 or ERC 44 is operating.

At the same time as the rules checker, 44 or 68, is making a forwarding determination, the buffer manager 65 obtains a free frame pointer from the free buffer pool 104. The free frame pointer specifies a location in external memory 34 available for storing the data frame currently stored in the receive FIFO 64. The buffer manager 65 transfers the data frame from the receive FIFO 64 over a data bus 80 (see FIG. 2) to the external memory 34 in a direct memory access (DMA) transaction, and the data frame is stored in the location pointed to by the free frame pointer obtained from the free buffer pool 104.

In the exemplary illustrated embodiment, the port vector is a 28-bit vector with a bit set for each output port identified as a destination port to which the data frame should be forwarded. Assuming that the received frame is a unicopy frame, only one bit corresponding to the one destination port is set in the port vector generated by the rules checker 44 or 68. Hence, the rules checker uses the port vector to assign the frame pointer to at least one destination port.

The rules checker, 44 or 68, places the port vector and the corresponding frame pointer (as well as a control opcode and a VLAN index) into the port vector FIFO 63. The port vector is examined by the port vector FIFO 63 to determine into which particular output queue 67 (or queues) the frame pointer associated with the port vector should be input. The port vector FIFO 63 assigns the frame pointer to the appropriate destination port(s) by placing the frame pointer into the top of the appropriate output queue 67, queuing the transmission of the data frame from the corresponding destination port. Hence, the frame pointer becomes an "assigned frame pointer," where it is assigned to a destination port.

At some point in time, the assigned frame pointer reaches the bottom of the output queue 67 after passing through the output queue 67. The buffer manager 65 takes the assigned frame pointer from the bottom of the output queue 67 using a frame pointer read bus 86, fetches the corresponding data frame in a DMA transaction from the location in external memory 36 pointed to by the assigned frame pointer, and places the fetched data frame into the appropriate transmit FIFO 66 via a data bus 82 (see FIG. 2) for transmission by the corresponding MAC layer.

IRC DIAGNOSTIC MODE

The present invention is directed to an IRC diagnostic mode. The discussion below assumes that the ERCI 42 is disabled and that the IRC 68 makes the data forwarding decisions.

As discussed above, the rules checker configuration register on the multiport switch 12 enables/disables the ERCI 42. The rules checker configuration register also enables an IRC diagnostic mode. When a designated bit is set in the rules checker configuration register, data sent to and from the IRC 68 is also transmitted outside the multiport switch 12.

Specifically, when the IRC diagnostic mode is enabled, the multiport switch 12 passes header information for the corresponding data frames to the IRC 68 and simultaneously transmits the same header information, via the ERCI 42. to an external device on ERC DATA [15:0]. The IRC 68 generates frame forwarding information based on the frame header information and outputs the frame forwarding information to the port vector FIFO. In addition, the IRC 68 simultaneously transmits the frame forwarding information to the external device, via the ERCI 42, on PRT VCTR [3:0].

PRT VCTR [3:0] is normally used to transmit data from ERC 44 to ERCI 42 when the ERCI 42 is enabled. However, PRT VCTR [3:0] is a bidirectional bus. Hence, the IRC 68 transmits frame forwarding information to the ERC 44 via PRT VCTR [3:0].

The external device that receives the output from the multiport switch 12 may be a logic analyzer. The logic analyzer is connected to ERC DATA and PRT VCTR and analyzes the functioning of the IRC 68. For example, the logic analyzer receives the frame header information on ERC DATA. The logic analyzer is configured to simulate the proper functioning of the IRC 68 and analyzes the actual result of the IRC 68 output on PRT VCTR. Hence, the logic analyzer determines whether the IRC 68 is functioning properly without requiring a direct probe of the multiport switch 12.

Alternatively, the multiport switch 12 may be modified to allow the IRC 68 and ERC 44 to check each other. Frame header information sent to the IRC 68 may simultaneously be sent to ERC 44 over ERC DATA while in IRC diagnostic mode. The ERC 44 can be configured to perform its data decision making and output a result on to PRT VCTR. The output from IRC 68 may be compared to the output of ERC 44 in order to determine if the results agree. If the results do not agree, the system may be configured to use the results of either one of the two decision making engines, or alternatively to stop processing.

In another alternative, an external device such as a logic analyzer may be connected to the PRT VCTR for receiving the results of IRC 68 while in the IRC diagnostic mode. The results of ERC 44 could also be sent to the logic analyzer to compare the results. Additional I/O pins may be required to avoid bus contention problems on PRT VCTR.

In a further alternative, the multiport switch 12 may be modified to have one of the two decision making engines take over for the other engine if a problem is detected in one of the two devices.

Described has been a system and method for diagnosing the IRC 68 to determine if it is working properly. An advantage of the invention is that the IRC 68 can be monitored without requiring complex hardware probing of he multport switch 12. Another advantage of the invention is that IRC 68 can be diagnosed over an existing data path without requiring additional pins.

In this disclosure, there is shown and described only the preferred embodiments of the invention, but, as aforementioned, it to be understood that the invention is capable of use in various other combinations and environments and is capable of changes or modifications within the scope of the inventive concept as expressed herein.

What is claimed is:

1. A multiport switch that controls communication of data frames between network stations comprising:

an internal switching engine configured for receiving frame header information from the data frames and for generating frame forwarding information;

an output configured for transmitting the frame header information to an external device; and a second output configured for transmitting the frame forwarding information to the external device.

2. The interface device of claim 1, wherein the frame header information comprises:

location information specifying where the frame is stored, a source address of the frame and a destination address of the frame.

3. The interface device of claim 2, wherein the data forwarding information further comprises forwarding port data.

4. The multiport switch of claim 1, further comprising:

a register configured for enabling the frame header information and data forwarding information to be transmitted to the external device.

5. The interface device of claim 1, wherein the frame header information further comprises a programmable number of bytes of data.

6. In an integrated switch that enables and controls communication of data frames between network stations, a method of verifying the operation of an internal switching engine, comprising:

a) receiving data from connected stations;

b) simultaneously sending header information from the received data to an internal switching engine located on the integrated switch and to an external device;

c) generating data forwarding information based on the header information; and d) transmitting the data forwarding information to the external device.

7. The method of claim 6, further comprising:

transmitting control information to the external device indicating a valid portion of the header information.

8. The method of claim 7, further comprising:

transmitting control information to the external device indicating that the forwarding information is valid.

9. In a multiport switch that controls communication of data frames between network stations, an interface device coupled to an internal switching engine, comprising:

a first output for transmitting frame header information from the corresponding data frames, wherein the frame header information is simultaneously transmitted to the internal switching engine and an external device;

a second output for transmitting data forwarding information, wherein the data forwarding information is generated by the internal switching engine and based on the frame header information.

10. The integrated switch of claim 9, wherein the frame header information comprises:

a source address of the frame and a destination address of the frame.

11. The interface device of claim 10, wherein the forwarding information comprises:

location information specifying where the frame is stored and forwarding port data.

12. The interface device of claim 9, wherein the interface device is enabled via a configuration register located on the multiport switch.

13. The interface device of claim 10, wherein the frame header information further comprises:

a programmable number of bytes of data.

14. The interface device of claim 11, wherein the forwarding information further comprises:

virtual local area network (VLAN) index information specifying another network or a prescribed group of stations.

* * * * *